United States Patent
Florence, Jr. et al.

(10) Patent No.: US 8,960,451 B2
(45) Date of Patent: Feb. 24, 2015

(54) RUGGEDIZING LARGE SERVER STORAGE FRAME

(75) Inventors: Robert F. Florence, Jr., Poughkeepsie, NY (US); Steven C. McIntosh, Kingston, NY (US); Budy D. Notohardjono, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 13/549,035

(22) Filed: Jul. 13, 2012

(65) Prior Publication Data

US 2014/0014599 A1     Jan. 16, 2014

(51) Int. Cl.
    *A47B 43/00*     (2006.01)

(52) U.S. Cl.
    USPC ............................. 211/26; 108/188; 211/201

(58) Field of Classification Search
    USPC ......... 211/26, 85, 133.1, 175, 182, 183, 186, 211/189, 190, 191, 195, 200, 201, 202, 204, 211/206, 103, 187, 192, 193, 207; 108/180, 108/181, 186, 187, 188; 248/122.1, 125.1, 248/637, 672, 676, 243, 244, 245; 312/265.1–265.4; 403/43, 187, 188, 403/233, 234
    See application file for complete search history.

(56) References Cited

U.S. PATENT DOCUMENTS

| | | | | |
|---|---|---|---|---|
| 1,569,358 A | * | 1/1926 | Cross | 211/182 |
| 3,009,582 A | * | 11/1961 | Degener | 211/191 |
| 3,193,060 A | * | 7/1965 | Park | 52/127.5 |
| 3,207,331 A | * | 9/1965 | Chasar | 211/175 |
| 3,235,038 A | * | 2/1966 | Nesslinger | 182/62.5 |
| 3,743,330 A | * | 7/1973 | Itatani | 403/44 |
| 3,851,764 A | * | 12/1974 | Anders | 211/1.56 |
| 3,967,327 A | * | 7/1976 | Severson | 5/9.1 |
| 4,044,448 A | * | 8/1977 | Watanabe et al. | 29/433 |
| 4,291,812 A | * | 9/1981 | Harmes et al. | 211/207 |
| 4,676,174 A | * | 6/1987 | Dingeldey | 108/157.1 |
| 4,728,066 A | * | 3/1988 | Lang et al. | 248/165 |
| 4,998,636 A | | 3/1991 | Hardigg | |
| 5,897,180 A | | 4/1999 | Singer | |
| 5,983,590 A | | 11/1999 | Serban | |
| 6,094,800 A | | 8/2000 | Gutelius et al. | |
| 6,129,224 A | * | 10/2000 | Mingers | 211/193 |
| 6,371,035 B1 | * | 4/2002 | Schiedegger et al. | 108/180 |
| 6,425,488 B1 | * | 7/2002 | Notohardjono et al. | 211/26 |
| 6,425,648 B1 | | 7/2002 | Notohardjono et al. | |
| 6,776,466 B2 | * | 8/2004 | Harvie, III | 312/351 |

(Continued)

FOREIGN PATENT DOCUMENTS

| | | | | |
|---|---|---|---|---|
| JP | 01310037 A | * | 12/1989 | E04B 1/58 |
| JP | 2008061884 A | | 3/2008 | |

*Primary Examiner* — Joshua Rodden
(74) *Attorney, Agent, or Firm* — Cantor Colburn LLP; Margaret McNamara (57) ABSTRACT

An apparatus includes a large server storage frame including a base, a ceiling and supports that are supportive of the ceiling above the base and separable from one another by a variable distance, first and second brackets disposable at variable vertical positions along first and second ones of the supports, respectively, and a turnbuckle assembly including an extendible member and first and second connectors connected to first and second ends of the extendible member, respectively. The first and second connectors are rotatably connectable to the first and second brackets, respectively, and the extendible member is extendible such that the first and second connectors reach the first and second brackets with the first and second brackets respectively disposed at the variable vertical positions.

6 Claims, 6 Drawing Sheets

(56) References Cited

U.S. PATENT DOCUMENTS

| | | | |
|---|---|---|---|
| 6,827,320 B2 * | 12/2004 | Yeh | 248/220.22 |
| 7,090,176 B2 * | 8/2006 | Chavot et al. | 248/127 |
| 7,187,543 B2 | 3/2007 | Zimlin | |
| 7,188,570 B2 * | 3/2007 | Schluter et al. | 109/59 R |
| 7,639,511 B2 | 12/2009 | Canfield et al. | |
| 7,848,109 B2 | 12/2010 | Barringer et al. | |
| 8,079,481 B2 | 12/2011 | Canfield et al. | |
| 8,123,186 B2 | 2/2012 | Barringer et al. | |
| 2002/0172013 A1 | 11/2002 | Chandler | |
| 2006/0283816 A1 | 12/2006 | Moore et al. | |
| 2007/0144993 A1 | 6/2007 | Knoop | |
| 2007/0278169 A1 * | 12/2007 | Grainger | 211/186 |
| 2008/0231151 A1 | 9/2008 | Barringer et al. | |
| 2009/0040692 A1 | 2/2009 | Barringer et al. | |
| 2009/0184072 A1 | 7/2009 | Fischer et al. | |
| 2011/0058339 A1 | 3/2011 | Le et al. | |

* cited by examiner

RUGGEDIZING LARGE SERVER STORAGE FRAME

BACKGROUND

The present invention relates to an apparatus and a method of ruggedizing a large server storage frame and, more particularly, to a method of ruggedizing a computing device rack for earthquake resistance.

Computing devices, such as servers, are typically stored in racks that house multiple computing devices at multiple heights. In a given server room, many racks can be provided with each rack storing the multiple computing devices. With each computing device being potentially responsible for running important applications and each computing device being relatively expensive, it can be seen that the racks need to be stable and secure. However, since the computing devices are also serviced and/or replaced frequently, it is also necessary for the racks to be easily opened and closed and modular.

The various requirements placed upon the racks often require tradeoffs between structural rigidity and usability. Normally, such tradeoffs can be made while taking into account computing device functionality, size and repair/replace schedules. However, earthquakes and other unplanned events can be difficult to account for since they are unpredictable and tend to expose the racks to forces well beyond design parameters. Indeed, the strongest earthquakes can destroy entire buildings let alone the server rooms that may be built inside.

SUMMARY

According to an aspect of the invention, an apparatus is provided and includes a large server storage frame including a base, a ceiling and supports that are supportive of the ceiling above the base and separable from one another by a variable distance, first and second brackets disposable at variable vertical positions along first and second ones of the supports, respectively, and a turnbuckle assembly including an extendible member and first and second connectors connected to first and second ends of the extendible member, respectively. The first and second connectors are rotatably connectable to the first and second brackets, respectively, and the extendible member is extendible such that the first and second connectors reach the first and second brackets with the first and second brackets respectively disposed at the variable vertical positions.

According to another aspect of the invention, an apparatus is provided and includes a large server storage frame including a base, a ceiling and supports that are supportive of the ceiling above the base and separable from one another by a variable distance, first and second brackets disposable at variable vertical positions along a first one of the supports, a third bracket disposable at a variable vertical position along a second one of the supports and first, second and third members by which the first and second brackets, the first and third brackets and the second and third brackets are connectable to one another, respectively.

According to yet another aspect of the invention, a method of ruggedizing a large server storage frame including a base, a ceiling and supports that are supportive of the ceiling above the base and separable from one another by a variable distance is provided. The method includes disposing brackets at variable vertical positions along first and second ones of the supports and rotatably connecting each one of the brackets disposed along the first one of the supports with a corresponding one of the brackets disposed along the second one of the supports.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In accordance with aspects of the invention, a rack is provided as a large server storage frame for storing and housing one or more computing devices, such as servers. The rack includes universal frame brackets that can be used with frames of different dimensions and different location constraints. The universal frame brackets do not require special mounting holes on the frame.

Figure 1:
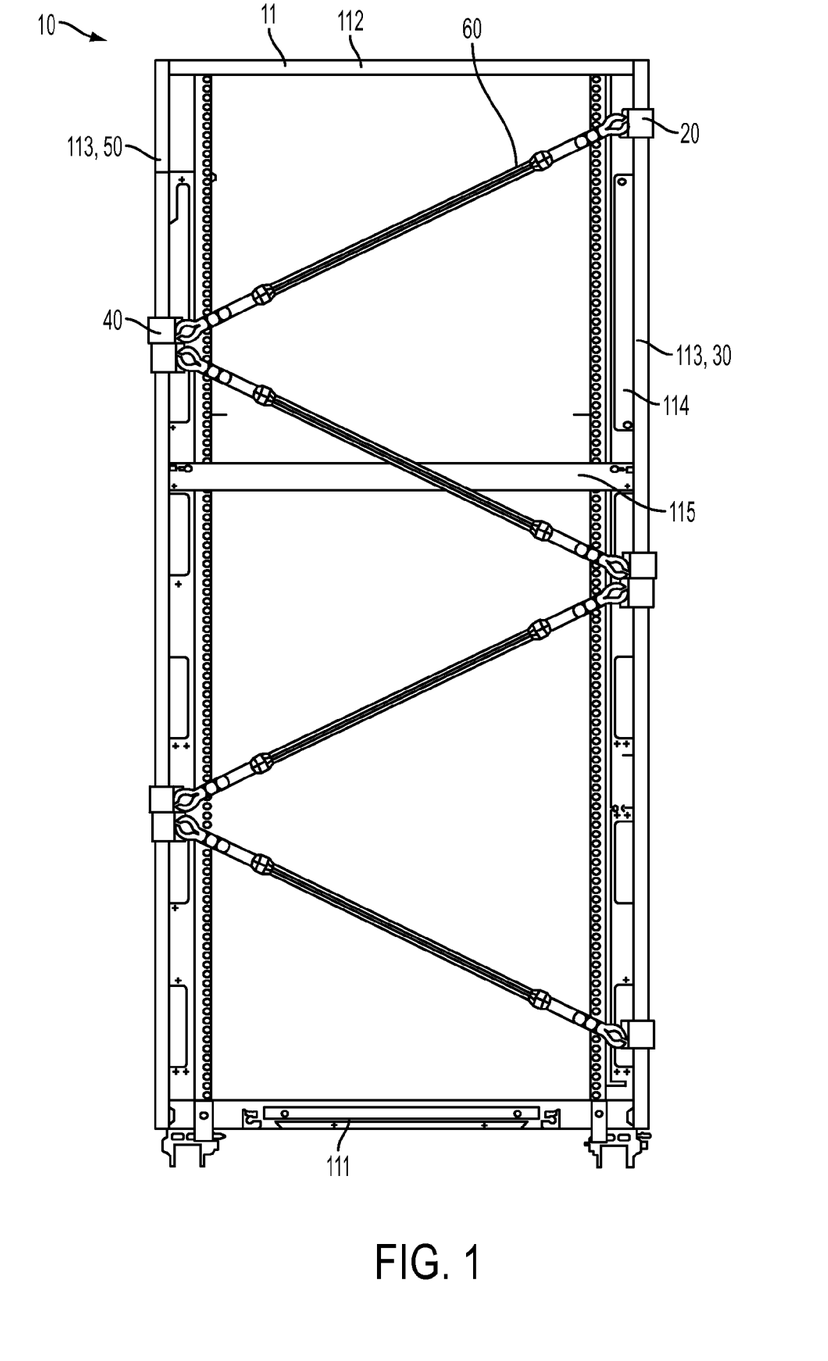
FIG. 1 is a side view of a ruggedized large server storage frame in accordance with embodiments.

With reference now to FIG. 1, an apparatus 10 to be used to ruggedize a large server storage frame 11 for storing a computing device, such as a server, is provided. The large server storage frame 11 includes a base portion 111, a ceiling portion 112 and vertical supports 113. The vertical supports 113 are angled to the base portion 111 and are configured to support the ceiling portion 112 above the base portion 111. The vertical supports 113 are separable from one another by variable distances that define a width and/or a depth of the large server storage frame 11.

In accordance with embodiments, the base portion 111 and the ceiling portion 112 may be substantially rectangular with the vertical supports 113 disposed at corresponding corners of the base portion 111 and the ceiling portion 112. Thus, each large server storage frame 11 will generally include four vertical supports 113. In accordance with further embodiments, the large server storage frame 11 may also include sidewalls 114 and levels 115. The sidewalls 114 are generally disposed at opposite sides of the storage frame 11 to increase structural rigidity and security for computing devices stored therein. The levels 115 are supported at given heights along the vertical supports 113 and define storage areas above and below the levels 115 in which computing devices can be disposed.

A first bracket 20 is disposed at any one of variable vertical positions along a first one of the vertical supports 113 (i.e., a first vertical support 30). A second bracket 40 is similarly disposable at any one of variable vertical positions along a second one of the vertical supports 113 (i.e., a second vertical support 50). Thus, the first bracket 20 and the second bracket 40 may be disposed at similar or different heights along a height-wise dimension of the storage frame 11 and, as such, the first bracket 20 may be displaced from the second bracket 40 by various distances that are reflective of an overall, variable width of the storage frame 11 as well as the height difference (if any) between the first bracket 20 and the second bracket 40. A turnbuckle assembly 60 is provided to couple the first bracket 20 to the second bracket 40 over any and all of those various distances.

Figure 2:
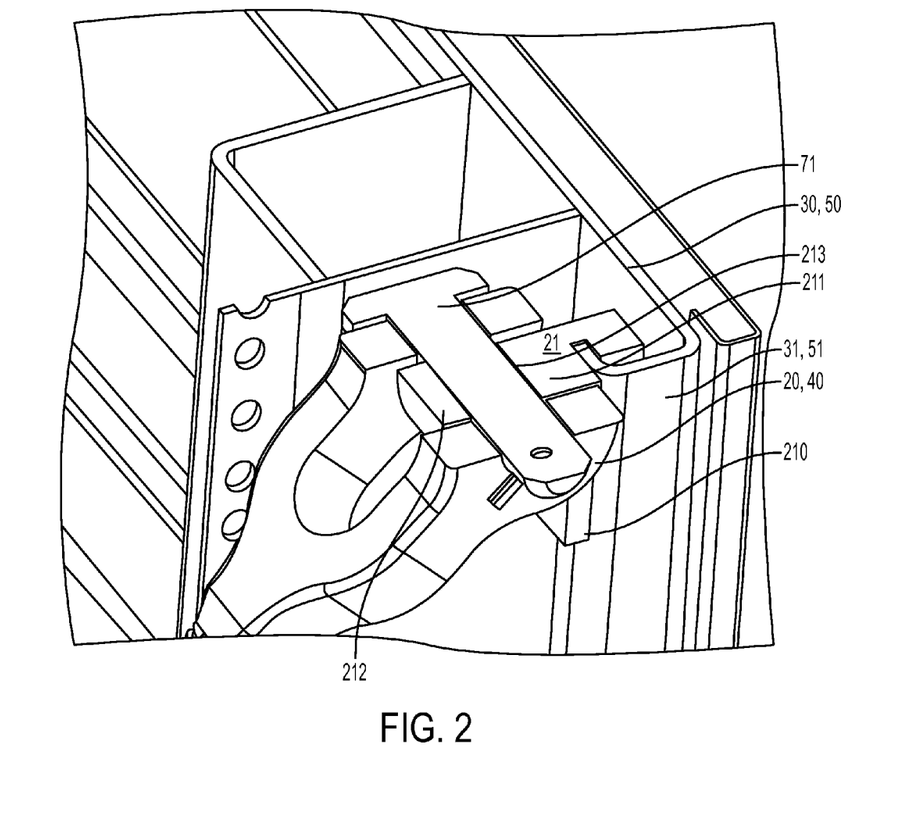
FIG. 2 is a perspective cutaway view of a bracket of the large server storage frame of FIG. 1.
Figure 3:
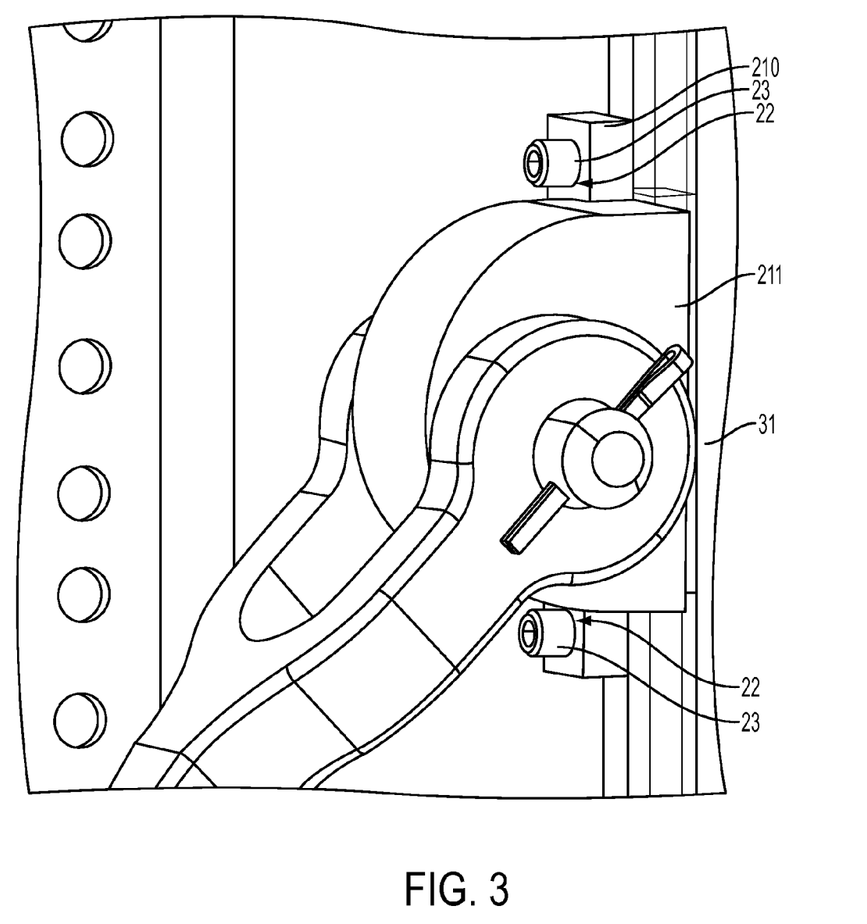
FIG. 3 is a perspective view of the bracket of FIG. 2.

With reference to FIGS. 2 and 3, the first vertical support 30 may include a slot-less guide wall portion 31 (hereinafter referred to as "guide wall portion 31") that may lack special mounting slots. The guide wall portion 31 extends substantially vertically and smoothly along the vertical length of the vertical support 30. The first bracket 20 can be slid along the vertical length and at least temporarily secured to the guide wall portion 31 at any height. The second vertical support 50 may similarly include a slot-less guide wall portion 51 (hereinafter referred to as "guide wall portion 51") that may also lack special mounting slots and along which the second bracket 40 can be slid and at least temporarily secured to at any height. Since neither the first or second bracket 20 and 40 requires special mounting slots defined in the guide wall portions 31 and 51, the first and second brackets 20 and 40 can be positioned at any heights required for stability and usability and to allow for accessibility to the computing device(s) stored in the storage frame 11.

The first bracket 20 may include a body 21 having a flange 210 and a connection portion 211. The flange 210 is configured to bracket the guide wall portion 31 and is formed to define through-holes 22 into which fasteners 23 are removably insertable. The fasteners 23 may be threaded into the through-holes 22 such that they impinge upon the guide wall portion 31 at a chosen height whereby the first bracket 20 is at least temporarily secured at the chosen height to the first vertical support 30. The second bracket 40 may be similarly constructed to be at least temporarily secured at the chosen height to the second vertical support 50. The connection portion 211 is integrally coupled to the flange 210 and includes a substantially rounded plate member 212 that is formed to define a through-hole 213.

Figure 4:
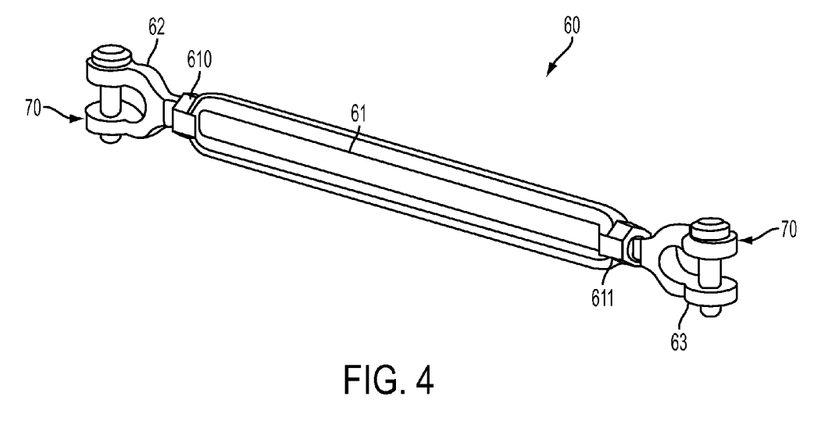
FIG. 4 is a perspective view of an extendible member of a turnbuckle assembly of the large server storage frame of FIG. 1.

With reference to FIG. 4, the turnbuckle assembly 60 comprises an extendible member 61 having first and second opposite ends 610, 611, a first connector 62 connected to the first end 610 and a second connector 63 connected to the second end 611. The first connector 62 includes a dovetail end 70 and is rotatably connectable to the first bracket 20 via a pin connection 71 (see FIG. 2) that extends through the dovetail end 70 and the through-hole 213. The second connector 63 also includes a dovetail end 70 and is rotatably connectable to the second bracket 40 via another pin connection 71. The extendible member 61 is extendible such that the first and second connectors 62 and 63 are able to reach the first and second brackets 20 and 40 with the first and second brackets 20 and 40 respectively disposed at the variable vertical positions.

Thus, for a large server storage frame 11 of variable width X, it may be understood that the first and second brackets 20 and 40 are disposable at different heights along the first and second vertical supports 30 and 50 such that the first and second brackets 20 and 40 may be separated by a variable distance Y that is based on the variable width X and the height difference. That is, as X increases or decreases, the distance Y similarly increases or decreases. By contrast, as X remains constant but either the first or the second bracket 20 or 40 is moved vertically, the distance Y also may increase or decrease. In any case, the extendible member 61 is configured to axially extend or retract in order to accommodate for the distance Y.

In accordance with further embodiments, the extendible member 61 may be provided as a plurality of extendible members 61 that are each rated for different widths of the large server storage frame 11. In this case, each unique extendible member 61 has a range of minimum to maximum lengths that can be assumed by the extendible member 61 such that a particular extendible member 61 may be a better fit for a given large server storage frame 11 having a first width and another extendible member 61 may be a better fit for a given storage frame 11 having a second width even though both extendible members 61 could be used for both large server storage frames 11.

In accordance with further aspects, the first bracket 20 may be provided as a set of first brackets, the second bracket 40 may be provided as a set of second brackets and the turnbuckle assembly 60 may be provided as a set of turnbuckle assemblies. That is, the first brackets 20 of the first set of brackets may each be disposed at variable vertical positions along the first vertical support 30 and the second brackets 40 of the second set of brackets may be similarly disposed at variable vertical positions along the second vertical support 50. The lowest turnbuckle assembly 60 would then be disposed to connect the lowest first bracket 20 to the lowest second bracket 40, the second lowest turnbuckle assembly 60 would be disposed to connect the second lowest first bracket 20 to the second lowest second bracket 40, and so on.

While each of the turnbuckle assemblies 60 may be similarly configured, it is to be understood that this is not necessary and that some may have unique characteristics. For example, the extendible members 61 of different turnbuckle assemblies 60 may have different length ranges. In these cases, for a single large server storage frame 11 having a given width, a first turnbuckle assembly 60 may be particularly fit for use with pairs of first and second brackets 20 and 40 that are disposed at substantially different heights and, by contrast, a second turnbuckle assembly 60 may be particularly fit for use with pairs of first and second brackets 20 and 40 that are disposed at substantially similar heights.

Figure 5:
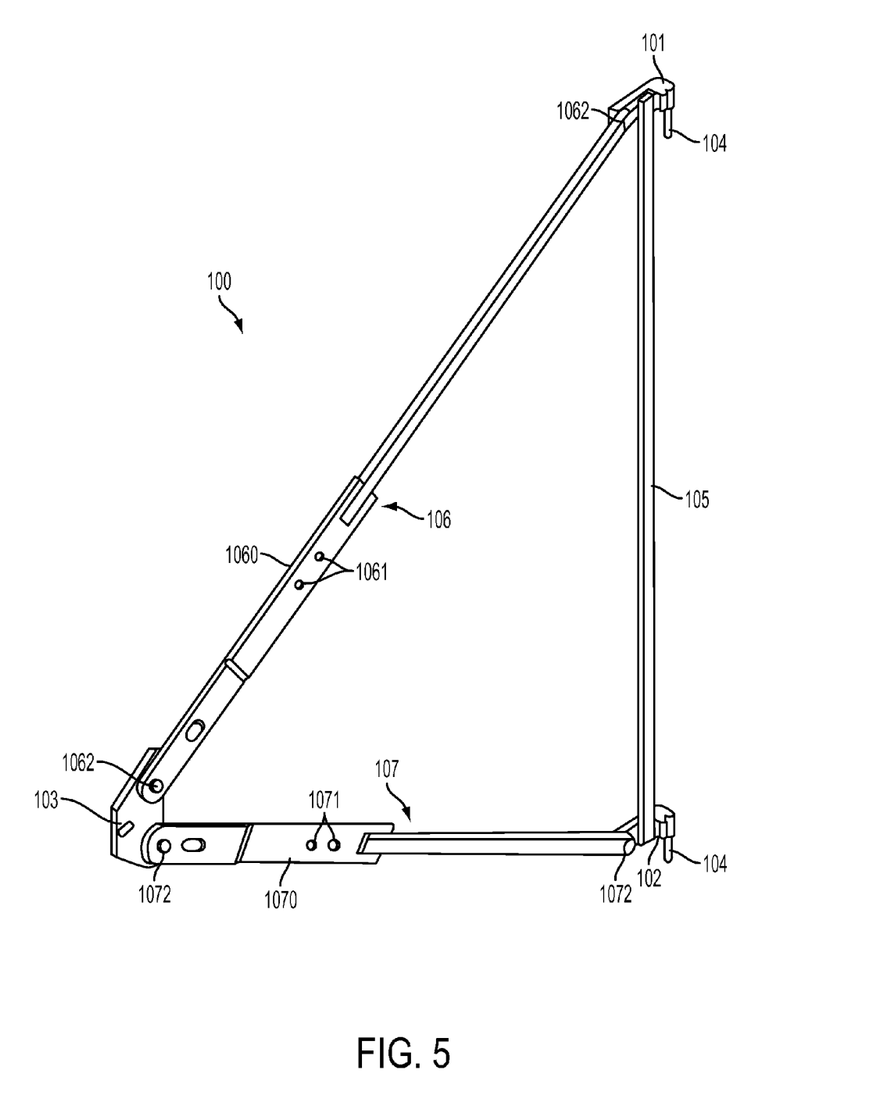
FIG. 5 is a perspective view of an apparatus for ruggedizing a large server storage frame in accordance with alternative embodiments.

With reference to FIG. 5, an apparatus 100 for ruggedizing a large server storage frame 11 (see FIG. 1) is provided in accordance with alternative embodiments. As described above, the large server storage frame 11 may include a base portion 111, a ceiling portion 112 and vertical supports 113 that are supportive of the ceiling portion 112 above the base portion 111.

As shown in FIG. 5, the apparatus 100 includes first and second brackets 101 and 102, which are disposable at variable vertical positions along a first one of the vertical supports 113 (i.e., the first vertical support 30), and a third bracket 103. The third bracket 103 is disposable at a variable vertical position along a second one of the vertical supports 113 (i.e., the second vertical support 50). The first, second and third brackets 101, 102 and 103 are removably attachable to the first and second vertical supports 30 and 50 by way of lockable hinges 104. The apparatus further includes a first member 105, a second member 106 and a third member 107. The first member 105 is configured to connect the first and second brackets 101 and 102. The second member 106 is configured to connect the first bracket 101 to the third bracket 103. The third member 107 is configured to connect the second bracket 102 to the third bracket 103.

The first member 105 may be a rigid, monolithic and elongate member that is integrally coupled to the first and second brackets 101 and 102 at respective ends thereof. The second member 106 may include a rigid, monolithic and elongate member as well as an adjustable member 1060 having a series of connection holes 1061 defined therein. The second member 106 is rotatably coupled to the first and third brackets 101 and 103 via pin connections 1062. The third member 107 may also include a rigid, monolithic and elongate member as well as an adjustable member 1070 having a series of connection holes 1071 defined therein. The third member 107 is rotatably coupled to the first and third brackets 101 and 103 via pin connections 1072.

Figure 6:
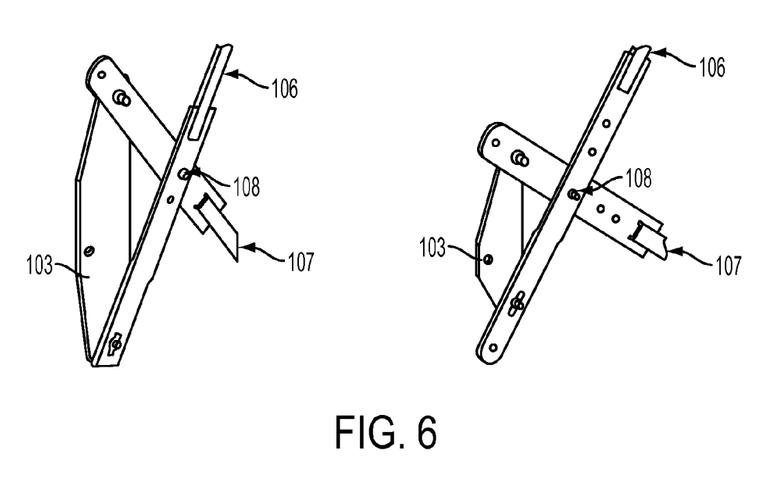
FIG. 6 includes perspective views of crisscrossing components of the apparatus of FIG. 5.

With the structure described above, the second and third members 106 and 107 may be rotatably coupled to the third bracket 103 at respective maximum distances for use with a particularly wide storage frame 11 in a first instance, as shown in FIG. 5. However, with reference to FIG. 6, it is to be understood that the second and third members 106 and 107 may also crisscross at a crossing point 108, which may be defined along each of the adjustable members 1060 and 1070 via the connection holes 1061 and 1071. By varying the location of the crossing point 108, the overall, effective length of each of the second and third members 106 and 107 can be increased or decreased for use with relatively narrow storage frames 11 in other instances.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus, comprising:
   a server storage frame including a base, a ceiling and supports that are supportive of the ceiling above the base and separable from one another by a variable distance, first and second ones of the supports including slot-less guide wall portions extending along respective entireties thereof;
   first and second brackets disposable at variable vertical positions at any height along the first and second ones of the supports, respectively, each of the first and second brackets being slidable along the slot-less guide wall portions of the first and second ones of the supports and comprising a flange configured to bracket opposite sides of a corresponding one of the slot-less guide wall portions and fasteners threadable through the flange to impinge upon the corresponding one of the slot-less guide wall portions at any ht to thereby fasten the one of the first and second brackets to the corresponding one of the first and second ones of the supports; and
   a turnbuckle assembly including an extendible member and first and second connectors connected to first and second ends of the extendible member, respectively,
   the first and second connectors being rotatably connectable to the first and second brackets, respectively, and
   the extendible member being extendible such that the first and second connectors reach the first and second brackets with the first and second brackets respectively disposed at the variable vertical positions.

2. The apparatus according to claim 1, wherein the extendible member is axially extendible.

3. The apparatus according to claim 1, further comprising pin connections by which the first and second connectors are rotatably connectable to the first and second brackets, respectively.

4. The apparatus according to claim 3, wherein the pin connections comprise dovetail pin connections.

5. A method of ruggedizing a server storage frame including a base, a ceiling and supports that are supportive of the ceiling above the base and separable from one another by a variable distance, the method comprising:
   disposing brackets at variable vertical positions at any height along first and second ones of the supports; and
   rotatably connecting each one of the brackets disposed along the first one of the supports with a corresponding one of the brackets disposed along the second one of the supports,
   wherein the brackets comprise first and second brackets and the disposing of the brackets comprises disposing the first and second brackets at any ones of variable vertical positions at any height along the first and second ones of the supports, respectively, and the rotatably connecting comprises forming a turnbuckle assembly including an extendible member and first and second connectors connected to first and second ends of the extendible member, respectively, such that the first and second connectors are rotatably connectable to the first and second brackets, respectively, and reach the first and second brackets,
   wherein the method further comprises:
   sliding each of the first and second brackets along slot-less guide wall portions extending along entireties of the first and second ones of the supports, respectively;
   bracketing the slot-less guide wall portions with a flange of the first and second brackets, respectively; and
   threading fasteners through each of the flanges such that the fasteners impinge upon the slot-less guide wall portions to thereby fasten the first and second brackets to the first and second ones of the supports, respectively, at any height.

6. The method according to claim 5, further comprising repeating the disposing and forming with at least one additional bracket and at least one additional turnbuckle assembly.

* * * * *